(12) United States Patent
Hashiba

(10) Patent No.: US 7,709,945 B2
(45) Date of Patent: May 4, 2010

(54) MULTICHIP SENSOR

(75) Inventor: Hitoshi Hashiba, Nisshin (JP)

(73) Assignee: Advics Co., Ltd., Kariya, Aichi-Pref. (JP)

( * ) Notice: Subject to any disclaimer, the term of this patent is extended or adjusted under 35 U.S.C. 154(b) by 567 days.

(21) Appl. No.: 11/489,467

(22) Filed: Jul. 20, 2006

(65) Prior Publication Data
US 2007/0045810 A1 Mar. 1, 2007

(30) Foreign Application Priority Data
Jul. 22, 2005 (JP) ............... 2005-213179

(51) Int. Cl.
H01L 23/48 (2006.01)
(52) U.S. Cl. ............ 257/690; 257/691; 257/E23.004
(58) Field of Classification Search .......... 257/690, 257/691, 723
See application file for complete search history.

(56) References Cited
U.S. PATENT DOCUMENTS
6,078,102 A * 6/2000 Crane et al. ............ 257/730
6,388,887 B1 * 5/2002 Matsumoto et al. ........ 361/760
2004/0102888 A1 5/2004 Burdorf et al.
2004/0119143 A1 * 6/2004 Karpman ............... 257/618
2006/0087006 A1 * 4/2006 Shirasaka et al. ......... 257/619

FOREIGN PATENT DOCUMENTS
JP 2001-091613 A 4/2001
JP 2004-506572 A 3/2004

* cited by examiner

Primary Examiner—Zandra Smith
Assistant Examiner—Paul E Patton
(74) Attorney, Agent, or Firm—Buchanan Ingersoll & Rooney PC

(57) ABSTRACT

A multichip sensor includes an element chip having a detection element of a sensor; a signal-processing IC chip having a signal-processing IC for processing an output signal of the detection element; and a package adapted to accommodate at least the element chip and the signal-processing IC chip and having a surface to be mounted on an ECU board. The plane of the element chip and the surface to be mounted on the ECU board are perpendicular to each other. The plane of the signal-processing IC chip, which is greater than the element chip, and the surface to be mounted on the ECU board are in parallel with each other.

11 Claims, 5 Drawing Sheets

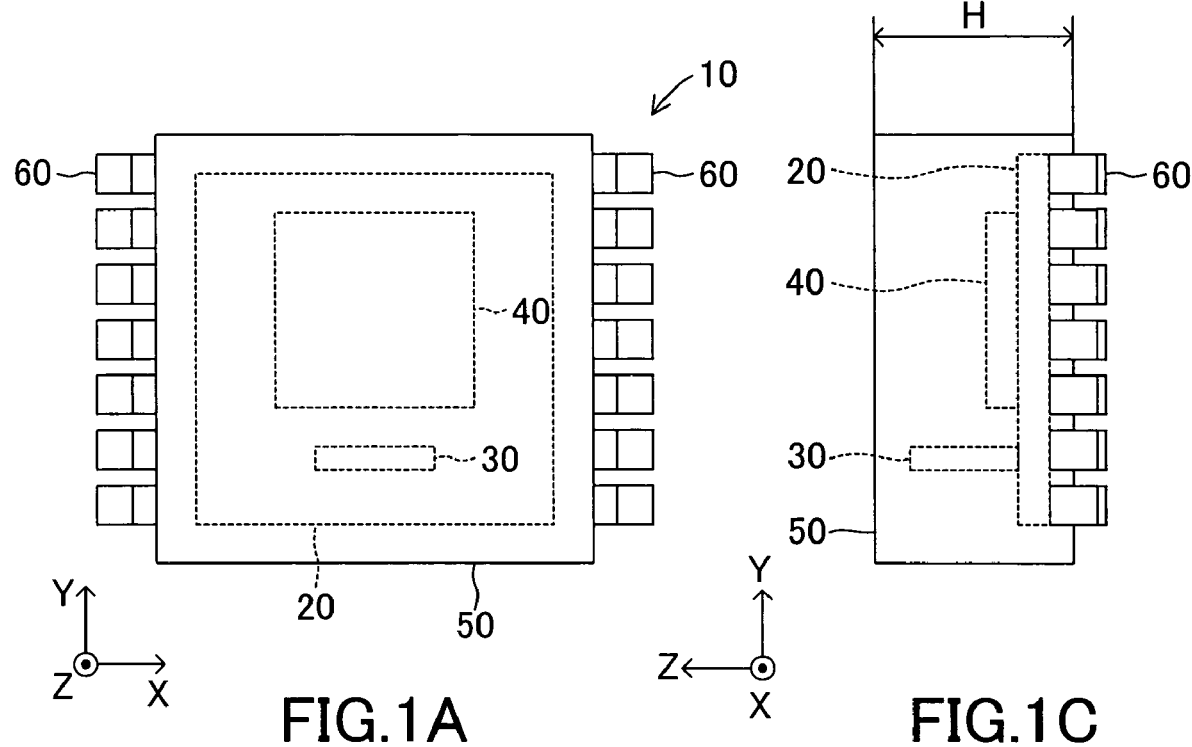
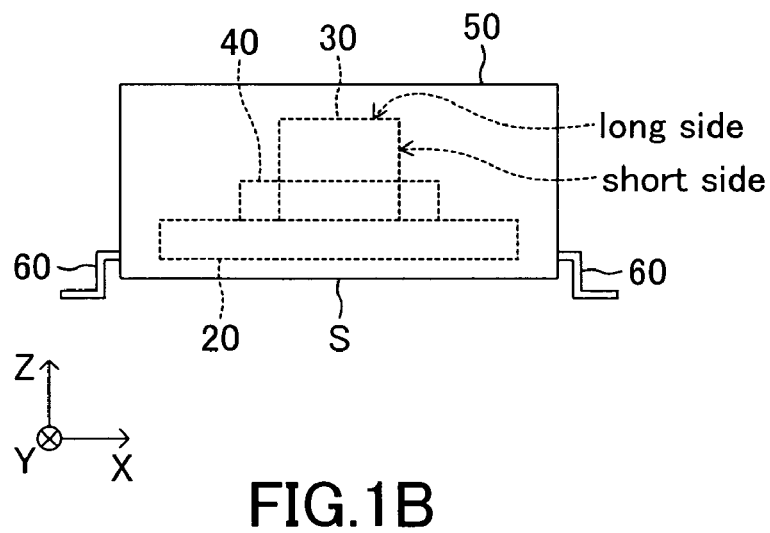

MULTICHIP SENSOR

BACKGROUND OF THE INVENTION

1. Field of the Invention

The present invention relates to a multichip sensor configured such that at least an element chip including a detection element of a sensor and a signal-processing IC chip including a signal-processing IC for processing an output signal of the detection element are accommodated within a package.

2. Description of the Related Art

Conventionally, a vehicular motion control apparatus is widely known for performing vehicle stabilization control for maintaining running stability of a vehicle at the time of cornering. Generally, the motion control apparatus includes an integral unit and various sensors, such as a yaw rate sensor, which are connected to the integral unit by use of, for example, harnesses and connectors. The integral unit is configured by integration of a hydraulic unit and an electronic control unit (ECU). The hydraulic unit carries a plurality of hydraulic devices, such as a plurality of solenoid valves and a hydraulic pump, for controlling braking force to be applied to wheels. The ECU controls the plurality of hydraulic devices. The integral unit receives signals from the yaw rate sensor and other sensors by means of so-called controller area network (CAN) communication and performs vehicle stabilization control.

In recent years, technology for accommodating a yaw rate sensor in the ECU of the integral unit (i.e., technology for directly mounting a yaw rate sensor on an ECU board (i.e., circuit board)) has been developed (refer to, for example, Japanese Kohyo (PCT) Patent Publication No. 2004-506572). This technology enables not only elimination of the above-mentioned harnesses and connectors, but also elimination, from the yaw rate sensor, of devices required for the above-mentioned CAN communication, such as a CPU and a CAN driver. Thus, the overall cost of manufacturing the motion control apparatus can be reduced.

A yaw rate sensor to be mounted directly on an ECU board assumes the form of a multichip sensor as described in, for example, Japanese Patent Application Laid-Open (kokai) No. 2001-91613. FIGS. 4A to 4C (plan view, front view, and right side view) show a typical multichip sensor for yaw rate detection which is mounted directly on an ECU board.

As shown in FIGS. 4A to 4C, a multichip sensor 1 for yaw rate detection includes a lead frame 2; an element chip 3 which includes a detection element for detecting a yaw rate of a vehicle; a signal-processing IC chip 4 which includes a signal-processing IC (custom IC, ASIC) for processing an output signal of the detection element; a package 5 which accommodates the lead frame 2, the element chip 3, and the signal-processing IC chip 4; and a plurality of terminals 6 which project from the package 5.

The element chip 3 and the signal-processing IC chip 4 are accommodated in the package 5 in such a manner that planes thereof (along which the element chip 3 and the signal-processing IC chip 4 extend, respectively) and a surface S of the package 5 for mounting on an ECU board (hereinafter may be called the "surface-for-mounting-on-ECU-board") are in parallel with one another (i.e., in parallel with an X-Y plane).

The yaw-rate detection element of the element chip 3 is a detection element of an ordinary gyro sensor which utilizes a Micro-Electro-Mechanical System (MEMS), whose development has been accelerated in various technical fields in recent years. The detection element of the gyro sensor is configured so as to detect a rotational rate about an axis perpendicular to the plane thereof.

Accordingly, the element chip 3 shown in FIGS. 4A to 4C is configured so as to detect a rotational rate about the Z-axis. In order to detect a yaw rate of a vehicle, the multichip sensor 1 for yaw rate detection shown in FIGS. 4A to 4C must be mounted directly on an ECU board such that the plane of the element chip 3 (surface-for-mounting-on-ECU-board S (X-Y plane)) is horizontal. Thus, the plane of the ECU board in the above-mentioned integral unit must be horizontal.

However, in the above-mentioned integral unit, in many cases, the ECU board is attached to a predetermined vertical surface of a hydraulic unit body in order to fulfill a desire to lay out of a plurality of hydraulic devices within the hydraulic unit. In other words, there arises a problem that the surface-for-mounting-on-ECU-board S of the package 5 must be vertical to the plane of the ECU board.

A conceivable solution of the above problem is that the position and direction of the terminals 6 projecting from the package 5 are changed so as to change the surface-for-mounting-on-ECU-board of the package 5 from the surface S (X-Y plane) to a surface S' (Y-Z plane shown in FIG. 4B). In other words, the conceivable solution is to lay the plane of the element chip 3 and the plane of the signal-processing IC chip 4 vertical to the surface-for-mounting-on-ECU-board S'. By this procedure, as shown in FIG. 5, when the surface-for-mounting-on-ECU-board S' of the package 5 (X-Y plane) is mounted directly on a vertical ECU board B, the plane of the element chip 3 (X-Z plane) lies horizontal.

However, in this case, since the signal-processing IC chip 4 also lies horizontal, the multichip sensor 1 for yaw rate detection requires a great height (horizontal length W in FIG. 5) from the ECU board B. This is because the size (length of a side of the top or bottom surface) of the signal-processing IC chip 4 is usually greater than that of the element chip 3.

Thus, in the case where the plane of the element chip is vertical to the plane of the ECU board (i.e., to the surface-for-mounting-on-ECU-board of the package), reducing the height of the multichip sensor from the surface-for-mounting-on-ECU-board has been desired.

SUMMARY OF THE INVENTION

In view of the foregoing, an object of the present invention is to provide a multichip sensor whose package has a surface-for-mounting-on-ECU-board to be mounted directly on an ECU board and accommodates at least an element chip and a signal-processing IC chip such that the plane of the element chip is vertical to the surface-for-mounting-on-ECU-board and whose height from the surface-for-mounting-on-ECU-board can be reduced.

To achieve the above object, a multichip sensor according to the present invention is configured such that a package having a surface for mounting on an ECU board accommodates at least an element chip comprising a detection element of a sensor, and a signal-processing IC chip comprising a signal-processing IC for processing an output signal of the detection element.

In the multichip sensor according to the present invention, the element chip is accommodated such that a plane along which the element chip extends (hereinafter referred to as the "plane of the element chip") and the surface to be mounted on the ECU board are perpendicular to each other, and the signal-processing IC chip is accommodated such that a plane along which the signal-processing IC chip extends (hereinafter referred to as the "plane of the signal-processing IC chip") and the surface for mounting on the ECU board are in parallel with each other.

According to the present invention, the plane of the element chip and the surface for mounting on the ECU board are perpendicular to each other, whereas the plane of the signal-processing IC chip, which is generally greater in area than the element chip, and the surface for mounting on the ECU board are in parallel with each other. Accordingly, as compared with the case shown in FIG. 5 where the plane of the signal-processing IC chip and the surface for mounting on the ECU board are perpendicular to each other, the height of the multichip sensor from the surface for mounting on the ECU board can be reduced.

Preferably, the multichip sensor according to the present invention is configured such that, in the case where the plane of the ECU board (i.e., the surface to be mounted on the ECU board) is a vertical plane, the element chip comprises a detection element for detecting a yaw rate of a vehicle. This allows use of an ordinary gyro sensor, which utilizes MEMS, as a detection element for detecting a yaw rate of a vehicle.

Alternatively, preferably, the multichip sensor according to the present invention is configured such that, in the case where the plane of the ECU board (i.e., the surface to be mounted on the ECU board) is a horizontal plane, the element chip comprises a detection element for detecting a roll rate of a vehicle. As will be described later, this allows use of an ordinary gyro sensor, which utilizes MEMS, as a detection element for detecting a roll rate of a vehicle.

BRIEF DESCRIPTION OF THE DRAWINGS

Various other objects, features and many of the attendant advantages of the present invention will be readily appreciated as the same becomes better understood by reference to the following detailed description of the preferred embodiments when considered in connection with the accompanying drawings, in which:

FIGS. 1A to 1C are a plan view, a front view, and a right side view, respectively, schematically showing a multichip sensor according to an embodiment of the present invention;

DESCRIPTION OF THE PREFERRED EMBODIMENT

Figure 2:
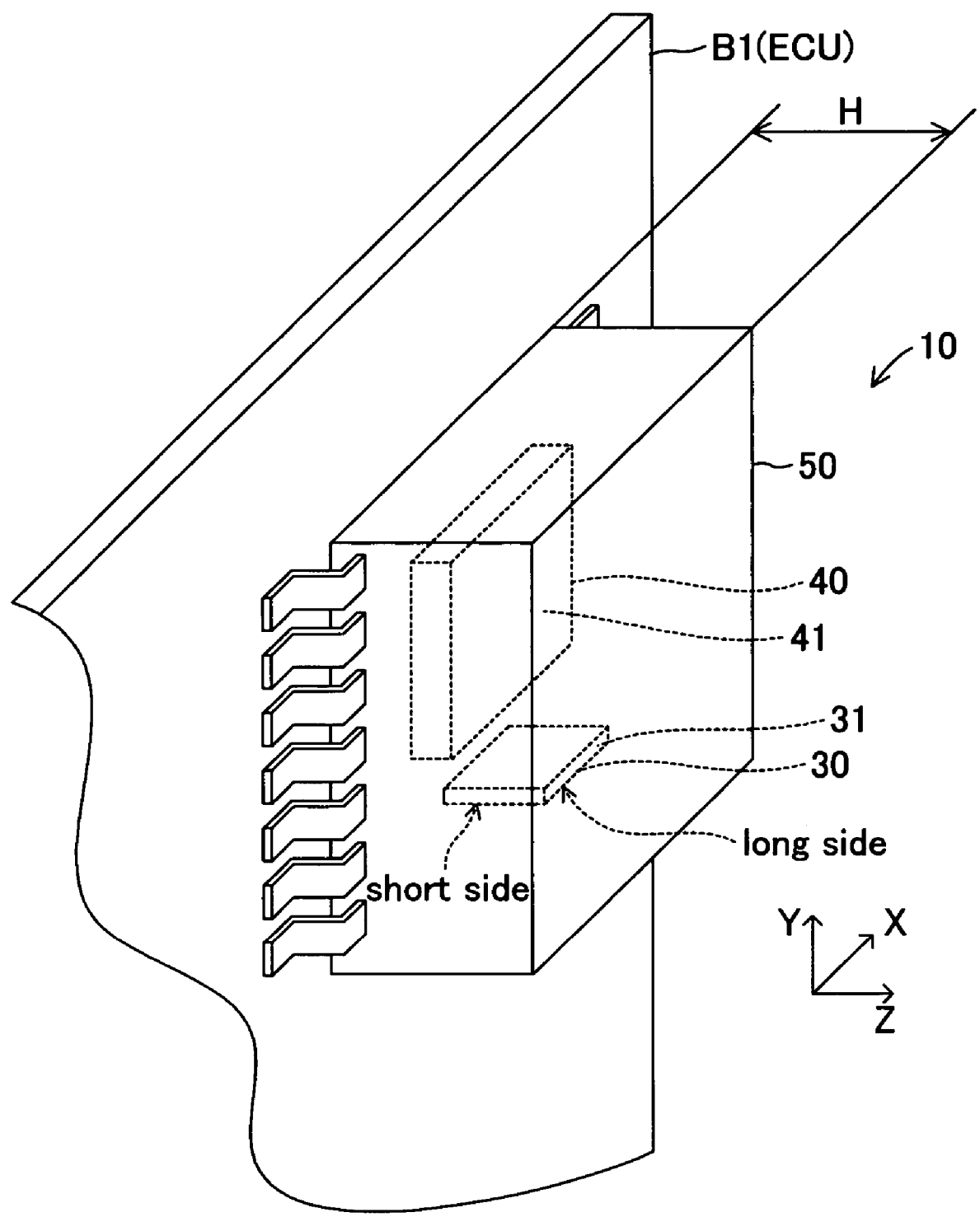
FIG. 2 is a schematic perspective view showing a case where the multichip sensor of FIG. 1 is mounted directly on a surface of a vertical ECU board (on a vertical surface)

An embodiment of a multichip sensor according to the present invention will next be described with reference to the drawings. FIGS. 1A to 1C schematically show a multichip sensor 10 according to the present embodiment in a plan view, a front view, and a right side view, respectively.

As shown in FIGS. 1A to 1C, the multichip sensor 10 for yaw rate detection includes a rectangular-parallelepiped-shaped (platy) lead frame 20; a rectangular-parallelepiped-shaped (platy) element chip 30 (detection chip) which includes a detection element of a gyro sensor which utilizes MEMS; a rectangular-parallelepiped-shaped (platy) signal-processing IC chip 40 which includes a signal-processing IC (custom IC, ASIC) for processing an output signal of the detection element; a rectangular-parallelepiped-shaped package 50 which accommodates the lead frame 20, the element chip 30, and the signal-processing IC chip 40; and a plurality of terminals 60 (in this example, 7 terminals in each of the two rows; i.e., 14 terminals in total) which project from the package 50. As is apparent from FIG. 1B, the element chip 30 has a short side (Z-axis direction) and a long side (X-axis direction). A first plane, along which the element chip extends, contains the short side line and the long side line.

Each of the element chip 30 and the signal-processing IC chip 40 is integrally fixed to and electrically connected (via unillustrated wires) to the lead frame 20. The lead frame 20 and the terminals 60 are electrically connected to one another (via unillustrated wires). Specifically, the lead frame 20 comprises a circuit pattern which is electrically connected to the element chip 30 and the signal-processing IC chip 40. The terminals 60 are electrically connected to the circuit pattern of the lead frame 20 and a circuit board (ECU board) of an electronic control unit of hydraulic devices (unillustrated). By means of this configuration, the signal-processing IC performs predetermined processing on an output signal of the detection element provided in the element chip 30, and the resultant signal is sent to an ECU board via the terminals 60. The terminals project in line parallel to another plane which contains thickness line and long side line of the detection chip.

The lead frame 20 is accommodated in the package 50 such that a plane (X-Y plane) along which the lead frame 20 extends (hereinafter referred to as the "plane of the lead frame 20" or second plane) and a surface-for-mounting-on-ECU-board S (X-Y plane) are in parallel with each other. The element chip 30 is accommodated in the package 50 such that a plane (first plane, X-Z plane) along which the element chip 30 extends (that is the plane which is perpendicular to the direction of thickness of the element chip 30, hereinafter referred to as the "plane of the element chip 30") and the surface-for-mounting-on-ECU-board S (X-Y plane), which is a surface to be mounted on the circuit board of the electronic control unit of the hydraulic devices (unillustrated), are perpendicular to each other. The signal-processing IC chip 40 is accommodated in the package 50 such that a plane (second plane, X-Y plane) along which the signal-processing IC chip 40 extends (that is the plane which is perpendicular to the direction of thickness of the signal-processing IC chip 40, hereinafter referred to as the "plane of the signal-processing IC chip 40") and the surface-for-mounting-on-ECU-board S (X-Y plane) are in parallel with each other. Another plane which contains thickness line and long side line of the detection chip is parallel to a plane which is perpendicular to the direction of thickness of the lead flame 20.

Figure 4A:
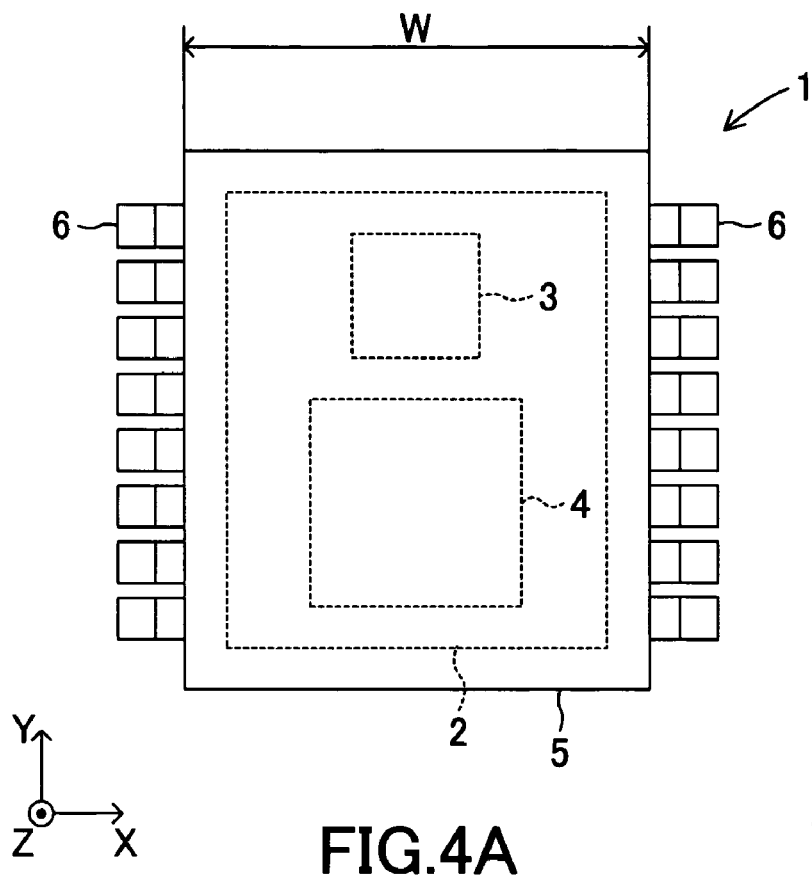
FIGS. 4A to 4C are a plan view, a front view, and a right side view, respectively, schematically showing a conventional multichip sensor.
Figure 4C:
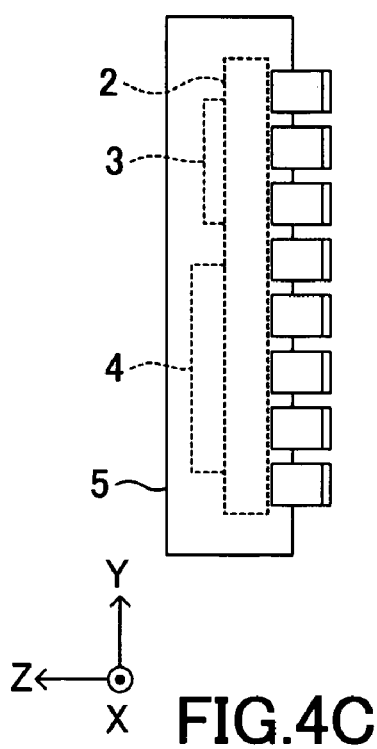
Figure 4B:
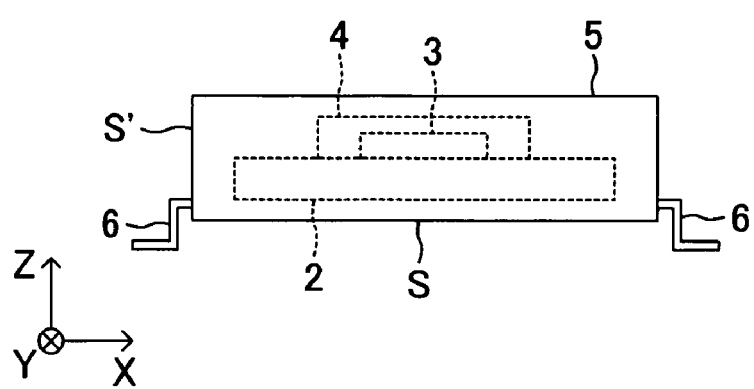

As in the case shown in FIG. 4, the detection element of a gyro sensor provided in the element chip 30 is configured so as to detect a rotational rate about an axis (Y-axis) perpendicular to the plane (X-Z plane) thereof.

FIG. 2 schematically shows, in a perspective view, a case where the multichip sensor 10 (surface-for-mounting-on-ECU-board S thereof) shown in FIGS. 1A to 1C is mounted directly on a surface (vertical surface) of an ECU board B1 (circuit board) contained in the aforementioned integral unit which is mounted on a vehicle for performing vehicle stabilization control.

In this case, the plane of the element chip 30 is a horizontal plane (X-Z plane). Accordingly, the detection element of a gyro sensor provided in the element chip 30 detects a rotational rate about a vertical line (Y-axis); i.e., the detection element serves as a detection element for detecting a yaw rate of a vehicle. In other words, in this case, the multichip sensor 10 serves as a multichip sensor for detecting a yaw rate of a vehicle.

As is apparent from FIG. 2, the plane of the element chip 30, which is smaller than the signal-processing IC chip 40, is horizontal, whereas the plane of the signal-processing IC chip 40 is vertical. Moreover, a height dimension (Z-axis direction) of the package 50 is less than both of a width dimension (X-axis direction) and a depth dimension (Y-axis direction) of the package 50, and the direction along the short side of the element chip 30 is perpendicular to the surface-for-mounting-on-ECU-board S (X-Y plane). A height dimension (Z-axis direction), which is perpendicular to the surface-for-mounting-on-ECU-board S, of the element chip 30 from the surface-for-mounting-on-ECU-board S, which height dimension is equal to a distance between the surface-for-mounting-on-ECU-board S and a surface 31 shown in FIG. 2, is higher than a height dimension (Z-axis direction), which is perpendicular to the surface-for-mounting-on-ECU-board S, of the signal-processing IC chip 40 from the surface-for-mounting-on-ECU-board S, which height dimension is equal to a distance between the surface-for-mounting-on-ECU-board S and a surface 41 shown in FIG. 2. Accordingly, as compared with the case (length W) shown in FIG. 5, the height (horizontal length H) of the multichip sensor 10 from the surface-for-mounting-on-ECU-board S can be made small.

Also, in the case of a multichip sensor for detecting a roll rate of a vehicle and mounted on the board of an ECU for performing curtain air bag control, the plane of an element chip is perpendicular to the plane of the ECU board (to the surface-for-mounting-on-ECU-board of the package).

Specifically, in many cases, the board of the ECU for performing curtain air bag control is disposed horizontally in a space under a seat of a vehicle. Since a roll rate of a vehicle is a rotational rate about a horizontal axis extending in the front-rear direction of the vehicle, the plane of the element chip must be perpendicular to the horizontal axis extending in the front-rear direction of the vehicle (i.e., vertical direction). Accordingly, the plane of the element chip is perpendicular to the plane of the ECU board (i.e., to the surface-for-mounting-on-ECU-board of the package).

Figure 3:
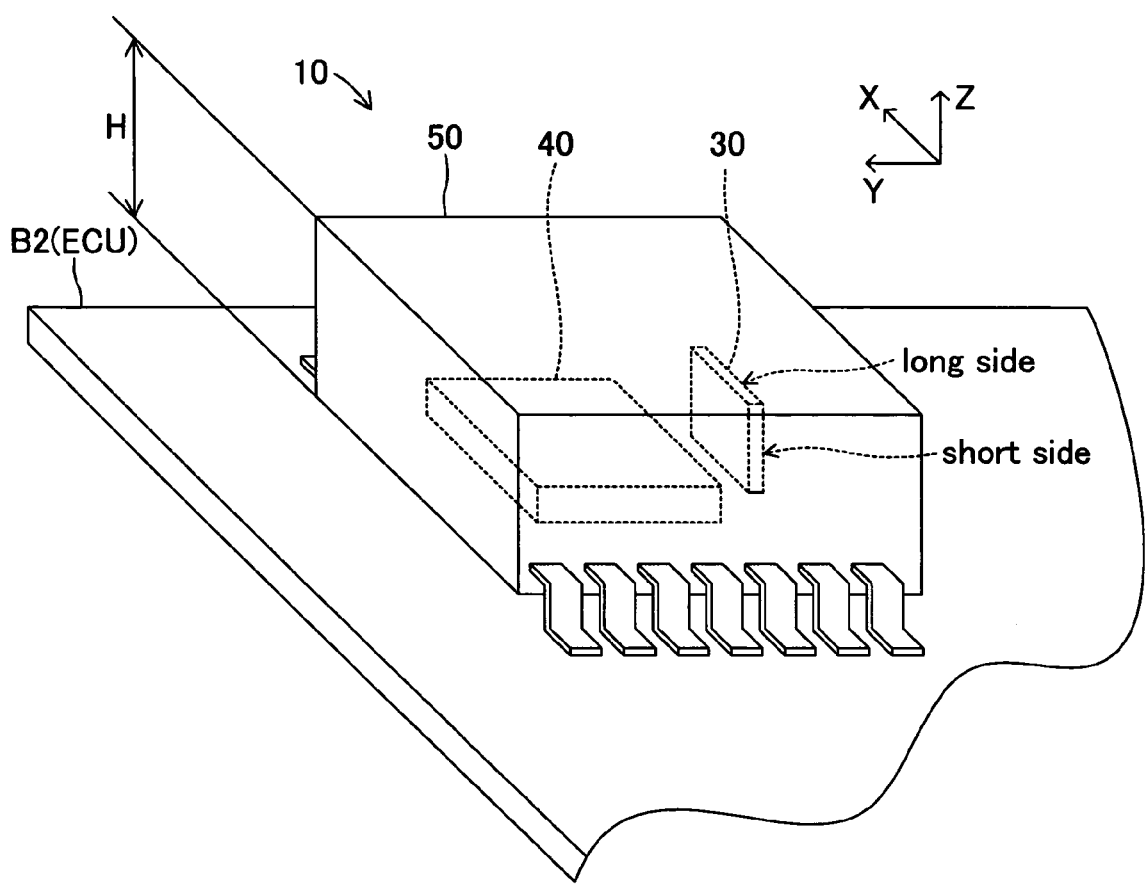
FIG. 3 is a schematic perspective view showing a case where the multichip sensor of FIG. 1 is mounted directly on a surface of a horizontal ECU board (on a horizontal surface)

FIG. 3 schematically shows, in a perspective view, a case where the multichip sensor 10 (surface-for-mounting-on-ECU-board S thereof) shown in FIGS. 1A to 1C is mounted directly on a surface (horizontal surface) of an ECU board B2 (circuit board) which is mounted on a vehicle for performing curtain air bag control.

In this case, the plane of the element chip 30 is a vertical plane (X-Z plane) perpendicular to the horizontal axis (Y-axis) extending in the front-rear direction of the vehicle. Accordingly, the detection element of a gyro sensor provided in the element chip 30 detects a rotational rate about the horizontal axis (Y-axis) extending in the front-rear direction of the vehicle; i.e., the detection element serves as a detection element for detecting a roll rate of a vehicle.

In this case, the plane of the element chip 30, which is smaller than the signal-processing IC chip 40, is vertical, whereas the plane of the signal-processing IC chip 40 is horizontal. Accordingly, as in the case of FIG. 2, as compared with the case (length W) shown in FIG. 5, the height (vertical length H) of the multichip sensor 10 from the surface-for-mounting-on-ECU-board S can be made small.

Moreover, in a case where the multichip sensor 10 shown in FIG. 3 is mounted on the surface (horizontal surface) of the ECU board B2 in such a manner that the multichip sensor 10 rotates by 90° about the vertical line (Z-axis) from the state shown in FIG. 3, the plane of the element chip 30 is a vertical plane (Y-Z plane) perpendicular to the horizontal axis (X-axis) extending in the lateral direction of the vehicle. Accordingly, the detection element of a gyro sensor provided in the element chip 30 detects a rotational rate about the horizontal axis (X-axis) extending in the lateral direction of the vehicle; i.e., the detection element serves as a detection element for detecting a pitch rate of a vehicle.

Figure 5:
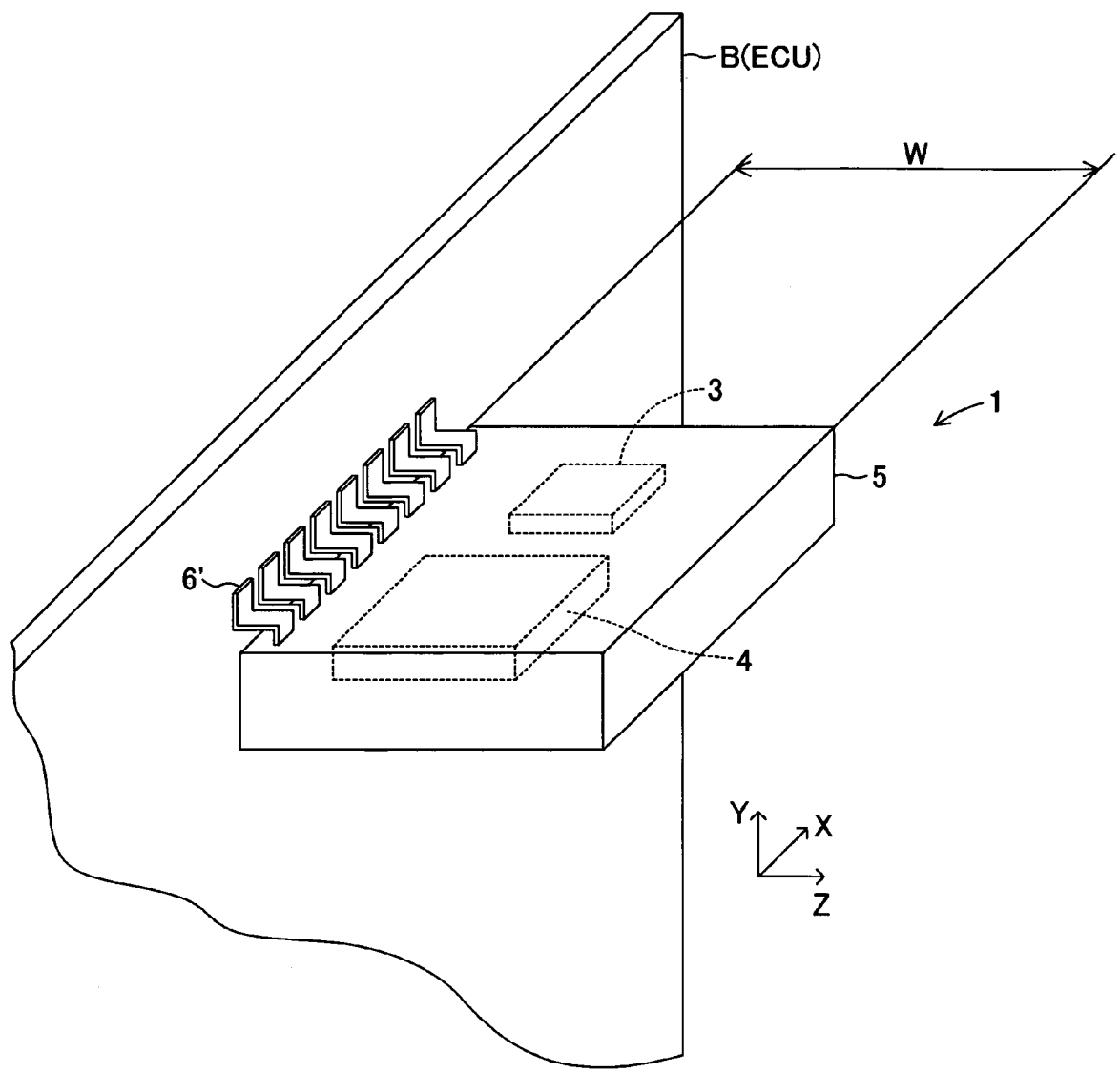
FIG. 5 is a schematic perspective view showing a case where the multichip sensor of FIG. 4 is mounted directly on a surface of a vertical ECU board (on a vertical surface).

Also in this case, as in the case of FIG. 3, as compared with the case (length W) shown in FIG. 5, the height (vertical length H) of the multichip sensor 10 from the surface-for-mounting-on-ECU-board S can be made small.

The element chip 30 can be accommodated in the package 50 such that a plane (X-Z plane) along which the element chip 30 extends is at an angle (e.g. 88°, 85°, 80°) deviating from 90° by a predetermined angle to, but is not parallel to, the surface-for-mounting-on-ECU-board S (X-Y plane).

Obviously, numerous modifications and variations of the present invention are possible in light of the above teachings. It is therefore to be understood that within the scope of the appended claims, the present invention may be practiced otherwise than as specifically described herein.

What is claimed is:

1. A multichip sensor comprising:
a platy and rectangular detection chip for detecting a yaw rate of a vehicle, the detection chip having a thickness, a first side and a second side, the first side being shorter than the second side, and the thickness being less than the length of the first side and the length of the second side;
a signal-processing IC chip for processing an output signal of the detection chip; and
a package adapted to accommodate the detection chip and the signal-processing IC chip and having a vertical surface to be mounted on a circuit board of an electronic control unit of hydraulic devices, the package having a height dimension which is perpendicular to the vertical surface, a width dimension and a depth dimension,
wherein the height dimension is less than both of the width dimension and the depth dimension of the package, and
the direction along the first side of the detection chip is perpendicular to the vertical surface of the package.

2. A multichip sensor according to claim 1, wherein:
a platy lead frame comprises a circuit pattern which is electrically connected to the detection chip and the signal-processing IC chip,
a plane which is perpendicular to the direction of thickness of the lead frame is parallel to another plane which contains the thickness of the detection chip and the second side of the detection chip,
the package has plural terminals which project in line parallel to the another plane, and
the terminals are electrically connected to the circuit pattern of the lead frame and the circuit board of the electronic control unit.

3. A multichip sensor according to claim 1, wherein:
a height dimension, which is perpendicular to the vertical surface, of the detection chip from the vertical surface is higher than a height dimension, which is perpendicular to the vertical surface, of the signal-processing IC chip from the vertical surface.

4. A multichip sensor comprising:
a plate-shaped detection chip for detecting a yaw rate of a vehicle, the detection chip having a plurality of surfaces including a pair of oppositely positioned rectangular first surfaces which both possess an area greater than the area of each of the other surfaces of the detection chip;

a signal-processing IC chip for processing an output signal of the detection chip;

a package adapted to accommodate the detection chip and the signal-processing IC chip and having a vertical surface to be mounted on a circuit board of an electronic control unit of hydraulic devices, the package having a height dimension which is perpendicular to the vertical surface, a width dimension and a depth dimension;

the height dimension of the detection chip is less than both of the width dimension and the depth dimension of the package; and an imaginary continuation of one of the rectangular first surfaces perpendicularly intersecting the vertical surface of the package.

5. A multichip sensor according to claim 4, wherein a first edge of the rectangular surface is shorter than a second edge of the rectangular surface, and the first edge of the rectangular surface extends in a direction perpendicular to the vertical surface of the package.

6. A multichip sensor comprising:

a plate-shaped detection chip for detecting a yaw rate of a vehicle, the detection chip having six sides including two opposing sides and four other sides, the two opposing sides both having a larger surface area than the four other sides of the detection chip;

a signal-processing IC chip for processing an output signal of the detection chip;

a package adapted to accommodate the detection chip and the signal-processing IC chip and having a vertical surface to be mounted on a circuit board of an electronic control unit of hydraulic devices, the package having a height dimension which is perpendicular to the vertical surface, a width dimension and a depth dimension;

the height dimension of the detection chip is less than both the width dimension and the depth dimension of the package; and an imaginary continuation of the two opposing sides of the detection chip perpendicularly intersecting the vertical surface of the package.

7. A multichip sensor according to claim 6, wherein each of the two sides which oppose each other have a first edge and a second edge, the first edge being shorter than the second edge, and the first edge extends in a direction perpendicular to the vertical surface of the package.

8. A multichip sensor according to claim 4, wherein:

a plate-shaped lead frame comprises a circuit pattern which is electrically connected to the detection chip and the signal-processing IC chip, a plane which is perpendicular to the direction of thickness of the lead frame is parallel to another plane which contains a thickness of the detection chip and a second edge of the rectangular surface of the detection chip, the package has plural terminals which project in line parallel to the another plane, and the terminals are electrically connected to the circuit pattern of the lead frame and the circuit board of the electronic control unit.

9. A multichip sensor according to claim 4, wherein:

a height dimension, which is perpendicular to the vertical surface, of the detection chip from the vertical surface is higher than a height dimension, which is perpendicular to the vertical surface, of the signal-processing IC chip from the vertical surface.

10. A multichip sensor according to claim 6, wherein:

a plate-shaped lead frame comprises a circuit pattern which is electrically connected to the detection chip and the signal-processing IC chip, a plane which is perpendicular to the direction of thickness of the lead frame is parallel to another plane which contains a thickness of the detection chip, the package has plural terminals which project in line parallel to the another plane, and the terminals are electrically connected to the circuit pattern of the lead frame and the circuit board of the electronic control unit.

11. A multichip sensor according to claim 6, wherein:

a height dimension, which is perpendicular to the vertical surface, of the detection chip from the vertical surface is higher than a height dimension, which is perpendicular to the vertical surface, of the signal-processing IC chip from the vertical surface.

* * * * *